United States Patent [19]

Anderson et al.

[11] Patent Number: 4,831,284

[45] Date of Patent: May 16, 1989

[54] TWO LEVEL DIFFERENTIAL CURRENT SWITCH MESFET LOGIC

[75] Inventors: Carl J. Anderson, Montrose; John F. Ewen, Yorktown Heights, both of N.Y.

[73] Assignee: International Business Machines Corporation, Armonk, N.Y.

[21] Appl. No.: 171,604

[22] Filed: Mar. 22, 1988

[51] Int. Cl.⁴ ............... H03K 19/017; H03K 19/094; H03K 17/687; H03K 19/20
[52] U.S. Cl. .................................... 307/450; 307/448; 307/475; 307/359; 307/574; 307/581
[58] Field of Search ............... 307/448, 450, 453, 468, 307/481, 455, 443, 279, 359, 475, 571, 584, 574, 581, 584, 575, 577, 304, 270

[56] References Cited

U.S. PATENT DOCUMENTS

| | | | |
|---|---|---|---|
| 3,028,506 | 4/1962 | Logue et al. | 307/88.5 |
| 3,619,646 | 11/1971 | Vittoz | 307/225 |
| 3,917,961 | 11/1975 | Reed | 307/243 |
| 4,041,326 | 8/1977 | Robinson | 307/216 |
| 4,237,387 | 12/1980 | Devendorf et al. | 307/203 |
| 4,311,925 | 1/1982 | Chang et al. | 307/455 |
| 4,445,051 | 4/1984 | Elmasry | 307/448 X |
| 4,496,856 | 1/1985 | Ransom et al. | 307/448 X |
| 4,506,171 | 3/1985 | Evans et al. | 307/455 |
| 4,532,440 | 7/1985 | Barre | 307/455 |
| 4,543,494 | 9/1985 | Wakimoto | 307/200 B |
| 4,585,957 | 4/1986 | Ooms | 307/455 |
| 4,661,725 | 4/1987 | Chantepie | 307/450 |
| 4,728,821 | 3/1988 | Yang et al. | 307/448 |
| 4,743,957 | 5/1988 | Hirayama | 307/450 |

OTHER PUBLICATIONS

Katsu et al., A Source Coupled FET Logic—A New Current-Mode Approach to GaAs Logics, IEEE Trans. on Elec. Devices, vol. ED-32, #6, Jun. 1985, pp. 1114–1118.

Takada, et al., An 11-GHz GaAs Frequency Divider Using Source-Coupled FET Logic, IEEE Elec. Device Letters, vol. EDL-7, No. 1, 1/86, pp. 47–48.

Primary Examiner—Stanley D. Miller
Assistant Examiner—David R. Bertelson
Attorney, Agent, or Firm—M. H. Klitzman; Jeffrey S. LaBaw

[57] ABSTRACT

A GaAs differential current switch (DCS) logic family is disclosed. Two cross-coupled, push-pull output buffer stages are coupled to the DCS logic circuit to increase the gain and to improve noise margins. The circuit is compatible with other GaAs logic families such as super buffer logic (SBL) or source follower logic (SFFL).

12 Claims, 6 Drawing Sheets

TWO LEVEL DIFFERENTIAL CURRENT SWITCH MESFET LOGIC

BACKGROUND OF THE INVENTION

This invention relates generally to cross coupled logic circuits. More particularly, it describes a dual level differential current switch logic in a GaAs MESFET technology which uses cross-coupled buffer stages to improve noise margins while maintaining high speed operation.

In bipolar technology, differential current switch (DCS) logic offers speed and power advantages, particularly for certain logic functions such as level sensitive latches, exclusive-OR functions, or multiplexers. However, in GaAs technology, it is difficult to design a DCS logic family due to the relative lack of control of the threshold voltages of the FETs and the less sharply defined switching of the differential pair compared to silicon bipolar logic.

Although DCS logic circuits are very efficient for certain types of important logic functions, e.g., latches, exclusive-OR, multiplexers, they are not efficient at implementing other functions such as multiple input ANDs, or multiple input NORs. In contrast, other GaAs logic families, especially super buffer logic (SBL) or source follower logic (SFFL), are very good at multiple input NORs and AND-OR circuits, but do not lend themselves to implementing latches.

It would be desirable, when designing GaAs logic circuits, to combine DCS latches, exclusive-ORs, multiplexers, etc. with SBL or SFFL multiple input ANDs and NORs. Unfortunately, known GaAs DCS circuits do not interface easily with other logic families due to differences in logic levels and power supply voltages. One known DCS circuit is described in IEEE Electron Device Letters, Vol. EDL-7, No. 1, January 1986, at pages 47-48. This divide by four circuit obtains the performance of current switch design in GaAs, however, it uses a different power supply (−3.4V or −2.3V) than are found in SBL or SFFL designs (1.5V) and it also uses different logic levels. Lowering the power supply of this DCS design to integrate it with an SBL of SFFL logic circuit would significantly decrease its noise margin. This noise margin problem could be improved by increasing the widths of the FETs, however, without changing the circuit topology, the circuit performance is compromised because of the additional capacitive loading of the larger gates.

SUMMARY OF THE INVENTION

In view of the foregoing, it is the principal object of this invention to design a GaAs DCS logic circuit which will easily interface with other GaAs logic families.

It is yet another object of this invention to improve the gain of the logic gate and therefore, to improve the noise margins.

Still another object of this invention is to design a GaAs DCS circuit to operate at a single supply voltage to be compatible with other GaAs logic families.

It is still yet another object of this invention to design a GaAs DCS circuit which can be manufactured using the same process parameters as used for other GaAs logic families.

These and other objects of this invention are achieved by the use of two cross-coupled, push-pull output buffer stages coupled to the true and complement signals from the DCS GaAs logic circuit. The output buffer stages increase the overall gain of the circuit to improve the noise margins, as well as level shift the signal back to near ground. Due to the circuit topology employed, a DCS type of circuit for GaAs MESFETs, one obtains high performance logic circuits which interface easily with other GaAs logic families and use the same power supplies and same logic levels as much as possible.

DETAILED DESCRIPTION OF THE DRAWINGS

Figure 1:
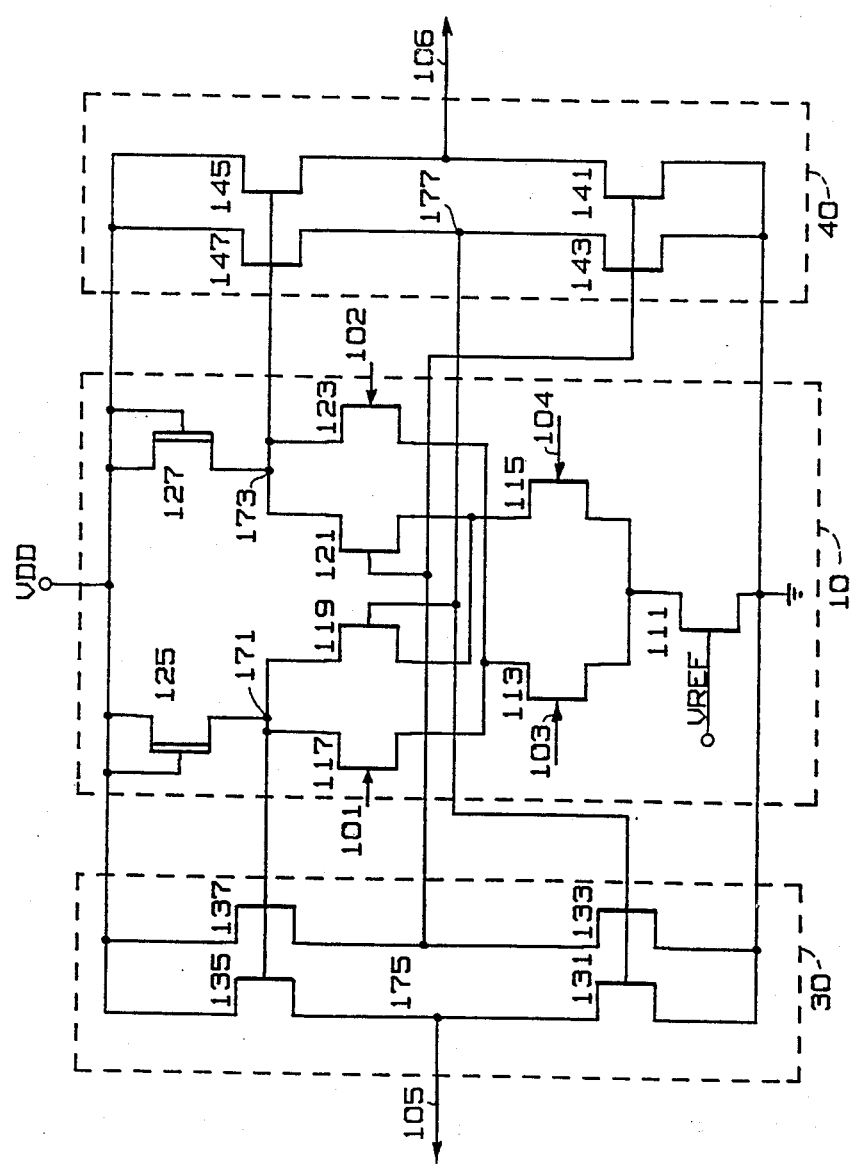
FIG. 1 is a schematic diagram of a preferred embodiment of a level sensitive D-type latch according to the present invention.

Referring to FIG. 1, a level sensitive D-type latch designed according to the principles of the present invention is shown.

Transistor 111 acts as a current source for the current switch tree 10. $V_{REF}$ is generated simply by a depletion mode current source tied to $V_{dd}$. Alternatively, a more sophisticated voltage reference could be used.

Transistors 113 and 115 form the first level current switches for the true clock line 103 and its complement 104. Transistors 113 and 115 are enhancement mode FETs, and the voltage levels used to drive these devices range from 0.0V to 0.7V.

Transistors 117, 119, 121, and 123 form the second level current switch for the true data line 101 and its complement 102, and provide feedback for the latch. Transistors 117 and 123 are the differential pair associated with the true clock line 103 and transistors 119 and 121 are the differential pair associated with the complement clock line 104. The gates of transistors 119 and 121 are connected to the cross coupled gates of transistors 131, 133, 141, 143 of the output stages of the latch and provide the feedback path. DCS type logic has an advantage in that only a single voltage level (approximately 1.5V) is required to drive both the first and second level current switches. The data input lines 101, 102 can be from the outputs of a separate super buffer logic gate with voltage levels of 0.0V to 1.4V.

Transistors 125 and 127 are depletion mode devices which act as load devices. They are designed with small W/L ratios and have their gates tied to the positive supply so that they act as resistive loads. The GaAs technology employed has inherent Schottky diodes from the gate to the source that clamps the down level. D-FET load devices are used instead of resistors both in DCS and in SBL and SFFL GaAs logic families. The process parameters associated with D-FETs are well controlled, while the resistors which could be made without major process changes may not be sufficiently well controlled to use as load devices. It would be possible to make special process modifications to use resistors, however, this would be very expensive and certainly less preferred. also, since the Schottky diode is built into the FET using a D-FET load, it takes up less area and is simpler to layout than a diode clamped resistor. For some applications, the load devices could be E-FET/D-FET combinations to vary the switching threshold.

The outputs 105 and 106 of the circuit tree 10 are buffered in push-pull output stages 30 and 40. The output stages 30 and 40 also shift the output back to near ground. Output 106 is the true output and output 105 is its complement. The dual level topology of the current switch requires that the output level be shifted near ground to be compatible with SBL or SFFL logic designs. The output stages 30 and 40 use separate source follower transistors 137 and 147 to drive the internal latch from source follower transistors 135 and 145 which are used with the buffered outputs 105 and 106. Separating the internal latch feedback from the buffered output minimizes the effect of external loading on the latch set up and hold time. The output stages 30 and 40 are cross-coupled to enhance the DC noise margins of the circuit. This is done by physically cross-coupling the gate of pull down transistors 131, 133 and 141, 143 to the sources of the internal source follower transistors of the output buffer stages 30 and 40, transistors 147 and 137 respectively.

DCS is a current mode or current steering type of logic circuit. For example, the differential pair formed by transistors 113 and 115 will switch the current from transistor 111 to one side of the circuit or the other. In the latch circuit pictured in FIG. 1, the differential pair formed by transistors 117 and 123 and transistors 119 and 121 switch the current from one load device 125 to the other 127, or vice versa.

In this embodiment, a differential signal is applied to the inputs, i.e., the true clock signal 103 and its complement 104 are equal magnitude signals, but opposite phase. This allows smaller signal swings while maintaining noise margins, and is faster since the circuit does not have to swing through as large a voltage range.

In bipolar technologies, A DCS type of arrangement is commonly called ECL (emitter coupled logic). In FET technology, a DCS type of circuit is not widely used. The term DCS is not widely used. However, some publications in the literature use the terms source coupled logic (SCL) or source coupled FET logic (SCFL) to describe a current mode or current steering type of logic circuit which utilizes FETs.

For a particular application, i.e., whether the speed, the size or the power requirements of the circuit is the primary concern, for the DCS circuit shown in FIG. 1 certain width/length ratios would be chosen for a given transistor. While in some cases the ratios chosen would represent limitations in existing GaAs fabrication techniques, the ratio of the width of the different FETs with respect to one another determine the switching characteristics of the DCS circuit. In particular, the ratio of transistors 125 and 127 relative to transistor 111 sets the switching threshold of the latch. The ratio between transistors 135 and 131, or 145 and 141, adjust the drive capability of the latch and pulse skew. By decreasing the gate length through improved GaAs fabrication technology, then all of the FETs are be decreased to maintain performance. Depending on the application, width/length ratios are chosen which as a particular trade-off of size, power, performance and other circuit characteristics.

Figure 2:
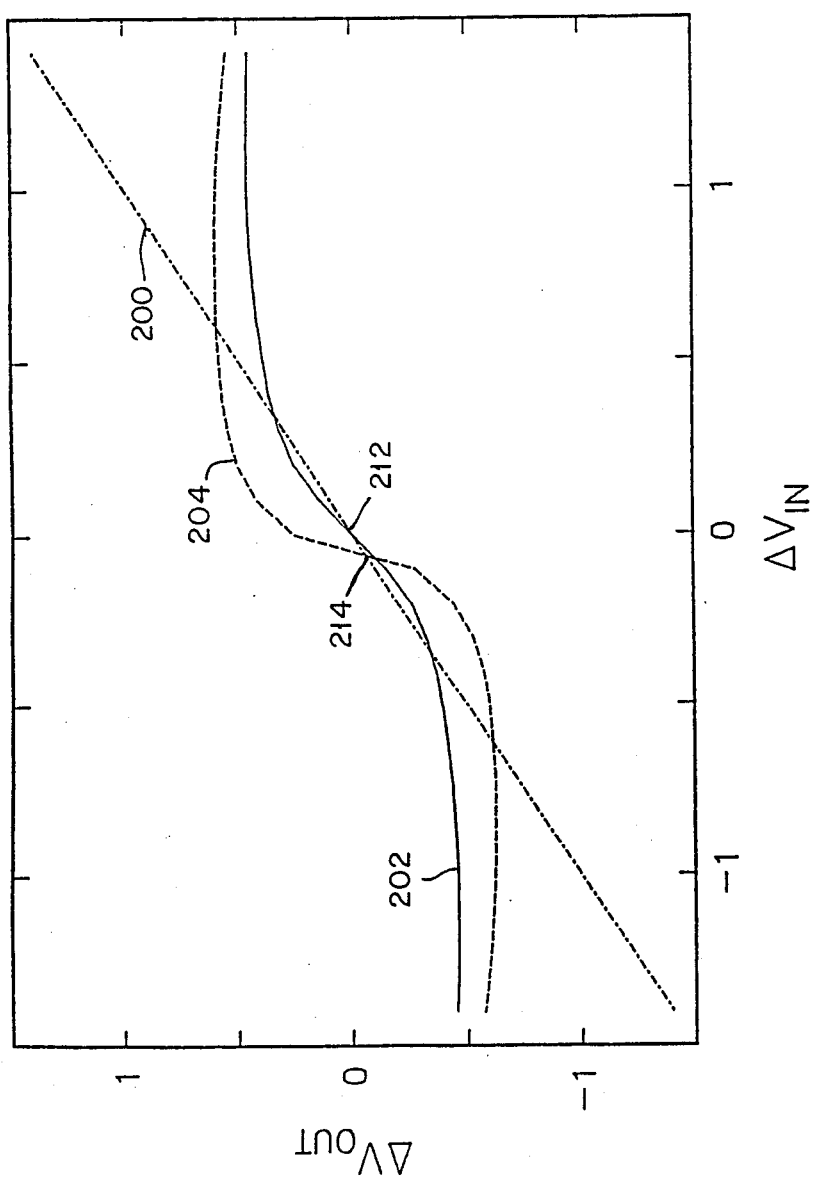
FIG. 2 is a diagram of a typical transfer curve for the embodiment of the present invention as shown in FIG. 1.

Referring now to FIG. 2, a typical transfer curve is shown for the level sensitive D-type latch described above. The output voltage is plotted versus the input voltage of the noninverting output of the DCS gate. This indicates that that circuit will achieve acceptable noise margins. The 45 degree line 200 is a reference for Vin=Vout. The solid curve 202 in FIG. 2 shows the output voltage without the cross-coupled output buffer 30 and 40. The dashed curve 204 shows the output voltage with the buffers 30 and 40. The points 212, 214 at which these curves 202, 204 intersect the 45 degree line 200 represent the switching threshold of the latch with or without the output buffers 30 and 40. The noise margin is represented by the distance of the Vout vs. Vin curves 202, 204 and the reference line 200. As a result of this invention, dramatic improvement is obtained in terms of gain and noise margins. The dramatic improvement in the noise margin is shown by the increase in the slope of the curve 204 surrounding the transition point 214 when compared to curve 202.

Figure 3:
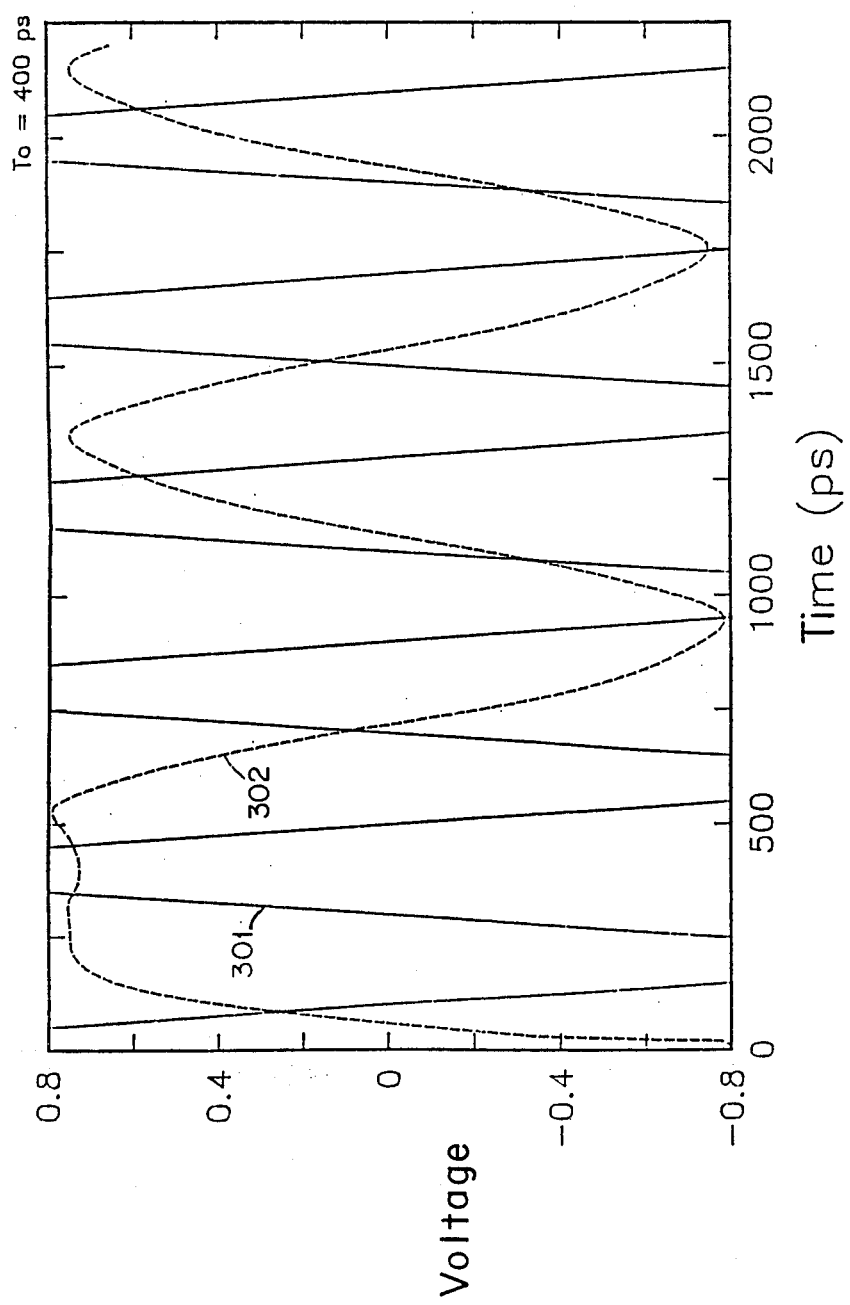
FIG. 3 is a diagram of the output of the embodiment of the present invention as shown in FIG. 1.

The DCS latch shown in FIG. 1 may be used as a divide by two counter. Referring to FIG. 3, a sample output of the DCS circuit in FIG. 1 used as a divide by two counter is shown. Using a modified square wave 400 ps input cycle depicted by solid line 301, the resulting output, depicted by dashed line 303, indicates that toggle frequencies in excess of 2.5 GHz are possible in this circuit. This is approximately a 2X improvement in speed over the prior art.

Figure 4:
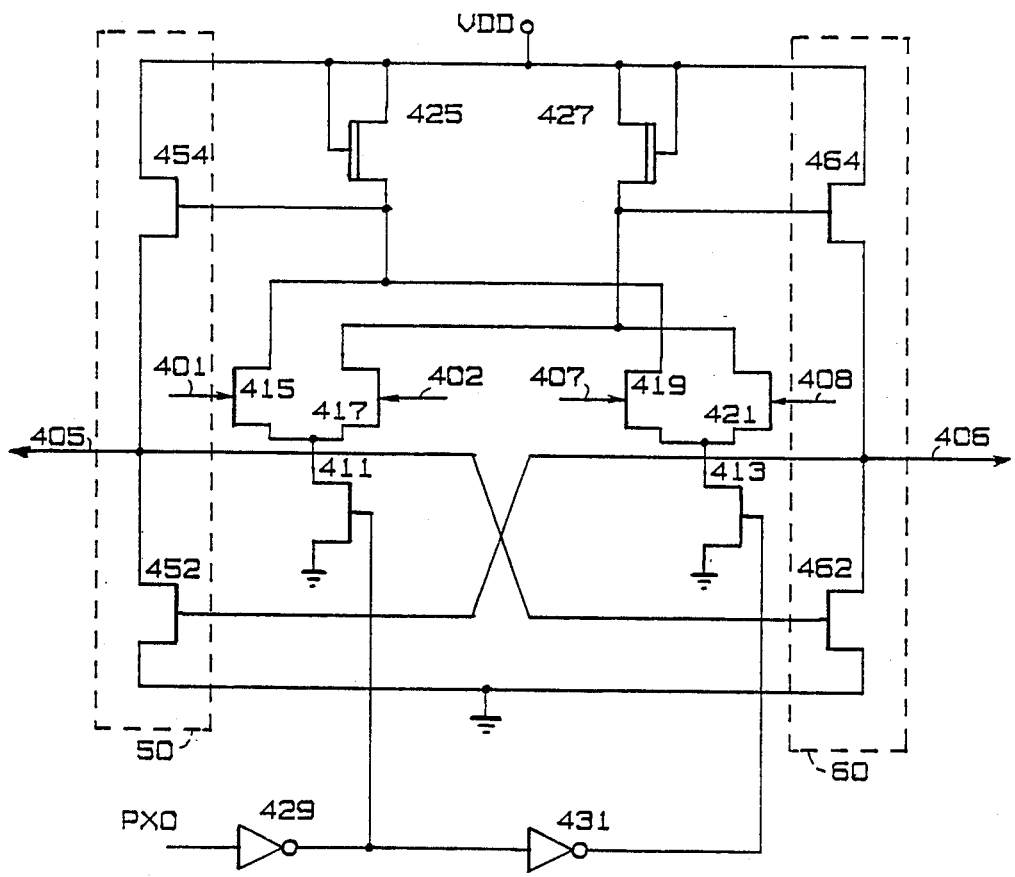
FIG. 4 is a schematic diagram of a preferred embodiment of a two way multiplexer circuit according to the present invention.

In FIG. 4, a two way multiplexer designed according to the principles of the present invention is shown.

Transistors 411, 415, and 417 form one input current switch stage for first true input 401 and its complement 402, and transistors 413, 419, and 421 form the current switch for the second true input 407 and its complement 408. Similar current switch stages would be included for additional inputs.

Transistors 425 and 427 are depletion mode devices which act as load devices, similar to transistors 125 and 127 in FIG. 1.

The true outputs of the current switch stages are connected to the source of transistor 427, while the inverting outputs of the current switch stages are wired to the source of transistor 425.

The outputs of the current switch stages are buffered by the push-pull output stages 50 and 60 which also level shift the outputs 405 and 406 back to near ground. The output stages 50 and 60 comprise source follower transistors 454 and 464, and pull-down transistors 452 and 462. Note that the push-pull output stages 50 and 60 differ from the push-pull output stages 320 and 40 in FIG. 1. Only a single pair of transistors is used in each output buffer stage. Using two pairs of transistors requires more chip area, but offers the advantage of isolating the internal nodes of the circuit from the external wiring capacitance. Where the wiring capacitance is very small, an output stage with a single pair of transistors may be used without slowing down the gates of transistors 452 and 462. As in output stages 30 and 40 of FIG. 1, the outputs 405 and 406 are cross-coupled to the gates of the pull-down transistors 452 and 462. This increases the output stage gain and the noise margin of the circuit.

Figure 5:
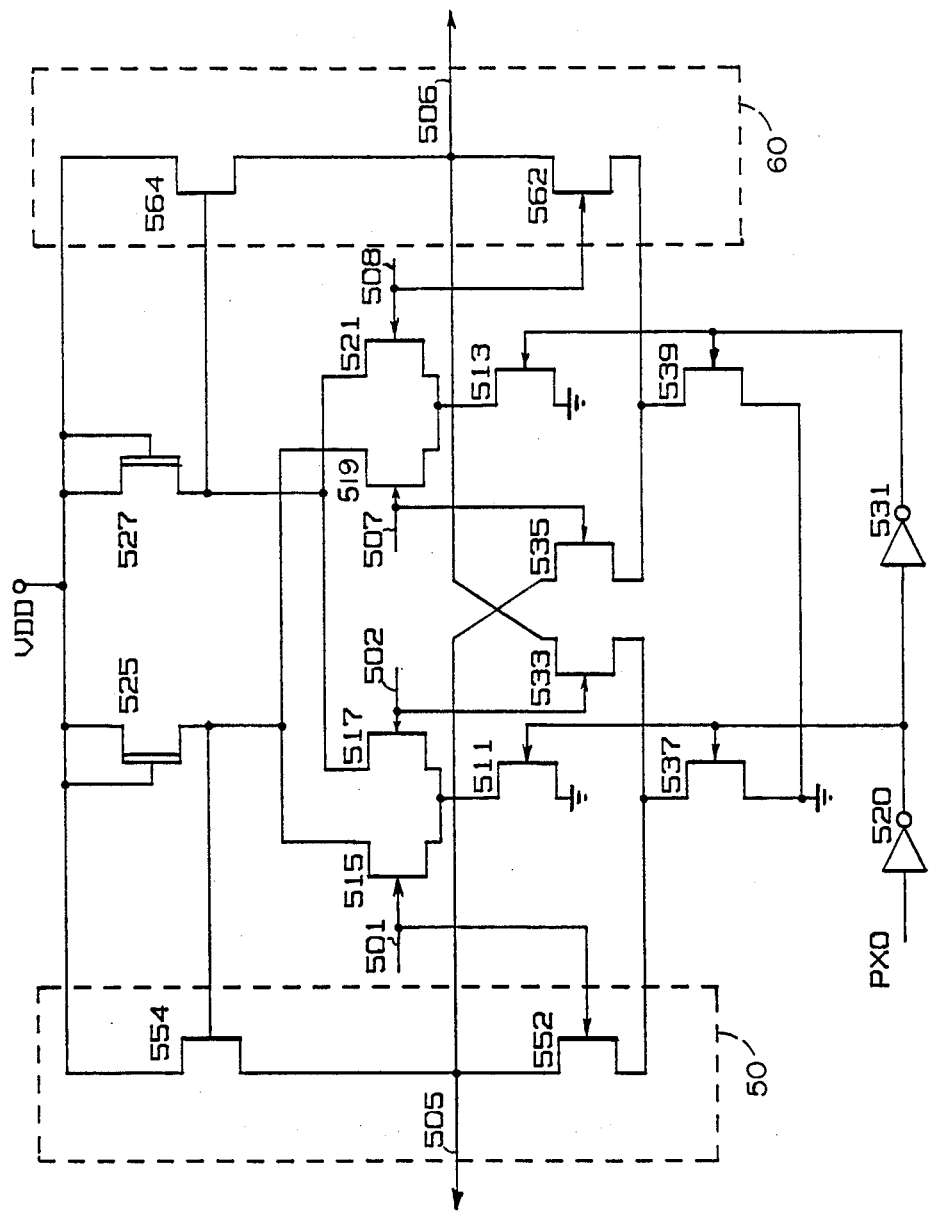
FIG. 5 is a schematic diagram of another preferred embodiment of a two way multiplexer circuit according to the present invention.

Referring to FIG. 5, another variation of a two way DCS multiplexer is depicted. The circuit is similar to the multiplexer in FIG. 4, except for the way in which the pull-down transistors 452 and 462 are cross-coupled. Another current stage is added, transistors 533, 537 form one branch, and transistors 535 and 539 the other.

Inputs 501 and 507 are logically equivalent to the output line 506. Similarly, complementary inputs 502 and 508 are logically equivalent to output line 505. This logical equivalence is true only for a limited number of functions of which latches and multiplexers are two important examples. However, this logical equivalence allows the output stages 50 and 60 to be effectively cross-coupled by physically coupling the gates of pull-down transistors 552 and 562 to inputs 501 and 508, respectively. In cross-coupling in this way, not only are the advantages of higher gain and better noise margins achieved but also, since the inputs 501 and 508 are fed directly to the output stages 50 and 60, the multiplexer in FIG. 5. is very fast. There is a trade-off in greater chip area, however, as the circuit requires more transistors and the transistors are relatively large.

Figure 6:
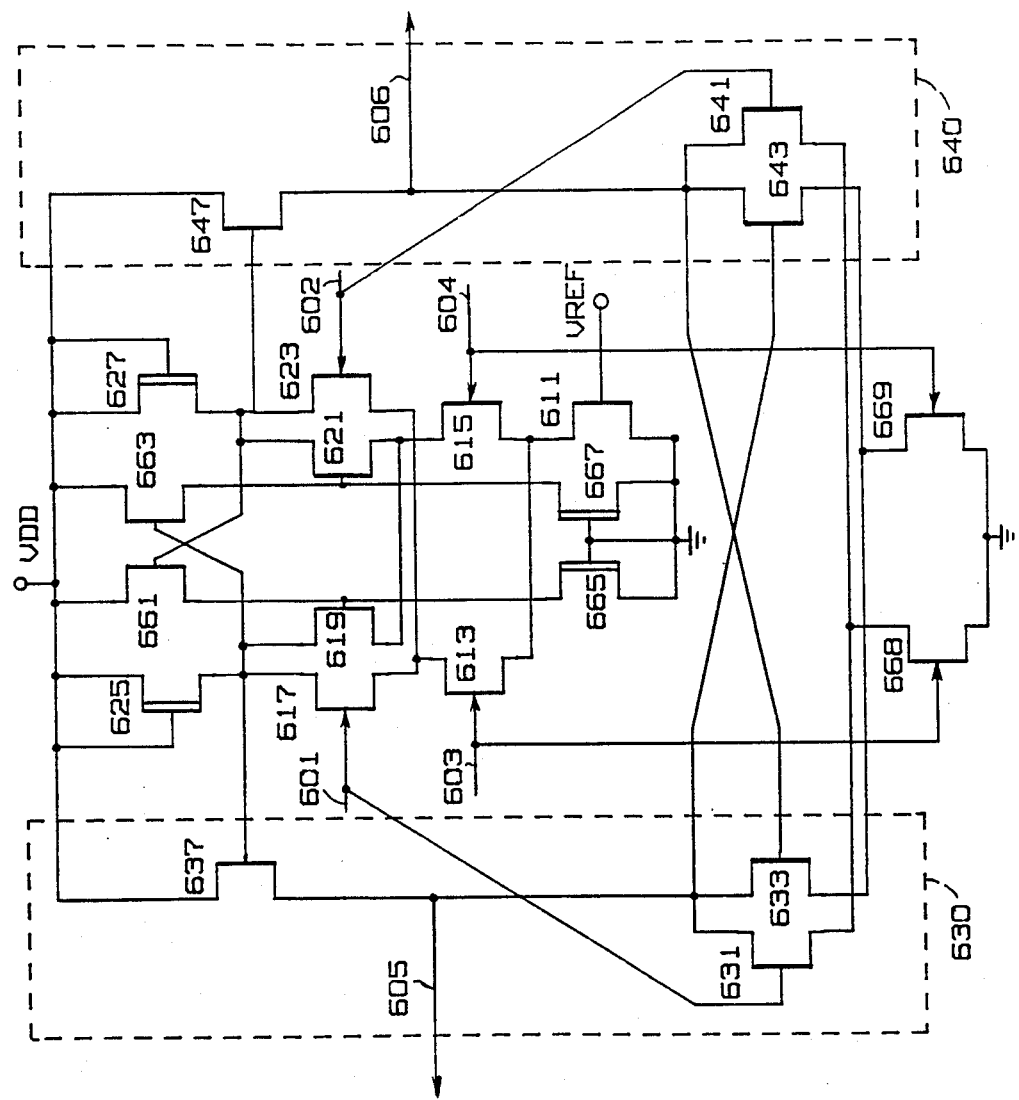
FIG. 6 is a schematic diagram of another preferred embodiment of a level sensitive D-type latch according to the present invention.

FIG. 6 shows a level sensitive D-type latch that uses both physical and logical cross coupling techniques. The gates of pull-down transistors 633 and 643 are physically cross-coupled to the outputs 606 and 605, respectively. The gates of transistors 631 and 641 coupled to inputs 601 and 602, respectively, are effectively cross-coupled due to the logical equivalence of the inputs and outputs in a DCS latch. This circuit illustrates two different ways of implementing the fundamental idea of cross-coupling the output stages. Depending on the application of the circuits illustrated in FIGS. 4, 5, and 6, a particular trade-off of size, power and performance will be chosen. The width/length ratios of the various transistors will be selected to implement that trade off.

OPERATION

The operation of the latch depicted in FIG. 1 is discussed below and is intended to be illustrative of how the other embodiment would likewise operate.

With both data input line 101 and clock line 103 at a voltage corresponding to a logical "1", current flows through the left half of the current tree. Therefore, node 171 is at a voltage which corresponds to a logical "0". A logical "0" is the input to the gates of transistors 135 and 137.

Simultaneous to data input line 101 and line 103 at logical "1", the complement data input line 102 and complement clock line 104 are at a voltage which corresponds to logical "0". Therefore, no current flows through the right half of the current tree. As a result, node 173 is at logical "1" and provides an input of logical "1" to the gates if source follower transistors 145 and 147, which turns transistors 145 and 147 on. Node 177 which corresponds to the source of source follower transistor 147, therefore, is at logical "1". Since node 177 is the input to pull down transistors 131 and 133, these transistors will be on. Since source follower transistor 137 is off (node 171 at logical "0") and pull down transistor 133 is off, node 175 will go to logical "0". Since node 175 is the input to pull-down transistors 141 and 143, these transistors will turn off.

Due to feedback between the output buffer stages 30 and 40, the voltage at node 177 is driven faster to logical "1" because transistor 143 is turned off and cannot pull node 177 down to logical "0". Since node 177 is driven faster to logical "1", pull-down transistors 131 and 133 are driven on faster, which in turn switches node 175 at logical "0" faster. The invention is the use of cross-coupling between the output buffer stages 30 and 40 to provide positive feedback which increases the overall speed of the latch.

The following is the operation of the latch when data input line 101 is at a voltage corresponding to logical "0" and clock line 103 is at a voltage which corresponds to logical "1". In this case, current flows through the right half of the logic tree. Node 173 goes to logical "0" and node 171 goes to logical "1". Node 173 provides the input to the gates of the source follower transistors 145 and 147 of output buffer stage 40 and node 171 provides the input to the gates of the source follower transistors 135 and 137 of the output buffer stage 30. Therefore, as transistor 137 is turned on, node 175 goes to logical "1". Node 175 is the input to the pull-down transistors 141 and 143 which turn on. Since transistor 143 is on, node 177 goes to logical "0" (transistor 147 being off since node 173 is at logical "0").

Again, feedback between the cross-coupled output buffer stages speeds the switching of the latch. Since pull-down transistor 133 is turned off, the voltage at node 175 is driven faster to logical "0". Node 175 then drives pull-down transistor 141 and 143 faster which in turn switches node 177 to logical "0" faster.

While this technique could be used with Si bipolar devices, the advantage is minimal because the Si bipolar transistors intrinsically have much larger gains than the GaAs MESFET. Therefore, the additional gain in the output buffer gives a smaller improvement. Because of the Schottky diode at the gate of the MESFET devices, the maximum signal swing is limited to about 700 mV (before the diode begins to conduct a significant amount of current). In Si MOSFETS the gate is dielectrically isolated from the channel, therefore, much larger signal swings are possible. This gives significantly larger noise margins, even though the gain of the circuit would be less. Because of the Schottky diodes used in this technology, the signals should be level shifted by the source follower stages in order to avoid forward biasing the diodes of the next stage. This situation is roughly analogous to saturation effects in a bipolar transistor.

While the invention has been described with respect to a particular preferred embodiment, it would be understood by those skilled in the art that modifications may be made without departing from the spirit and scope of the present invention. For example, an exclusive-OR or multiplexer circuit may be made according to principles of the invention. Other types of latches may be fabricated. Other choices of FET widths may be made depending on the particular application. These embodiments are for purposes of example and illustration only and are not to be taken to limit the scope of the appended claims.

We claim:

1. A GaAs differential current switch circuit having first and second outputs comprising:
   an inner circuit using differential current switch logic having first and second differential inputs and first and second outputs,
   first and second cross-coupled push-pull output buffer stages which comprise source follower and pull-down transistors to increase the gain and to improve the noise margins of the inner circuit where the gate of the source follower transistor of the first output stage is connected to the first output of the inner circuit, the gate of the source follower transistor of the second output stage is connected to the second output of the inner circuit, the gate of the pull-down transistor of the first output stage is cross-coupled to the source of the source follower of the second output buffer stage and the gate of the pull-down transistor of the second output stage is cross-coupled to the source of the first source follower of the output buffer stage.

2. A GaAs differential current switch circuit as recited in claim 1 where the first and second output buffer stages further comprise:
 a second source follower transistor and a second pull-down transistor in each output buffer stage to minimize the effect of external wiring capacitance on the inner circuit where the gates of the first and second source follower transistors of each output buffer stage are connected, the gates of the first and second pull-down transistors of each output buffer stage are connected, the source of the second source follower transistor of the first output buffer is connected to the first output of the GaAs differential current switch circuit, and the source of the second source follower transistor of the second output buffer is connected to the second output of the GaAs differential current switch circuit.

3. A GaAs differential current switch circuit as recited in claim 1 where the first and second output buffer stages further comprise:
 a second pull-down transistor in each output buffer stage where the gate of the second pull-down transistor in the first output buffer stage is connected to the first differential input and the gate of the second pull-down transistor of the second output buffer stage is connected to the second differential input.

4. A GaAs differential current switch circuit as recited in claim 1 where the inner circuit is a latch.

5. A GaAs differential current switch circuit as recited in claim 1 where the inner circuit is a multiplexer.

6. A GaAs differential current switch circuit having first and second outputs comprising:
 an inner circuit using differential current switch logic having first and second differential inputs and first and second outputs,
 first and second cross-coupled push-pull output buffer stages which comprise source follower and pull-down transistors to increase the gain and to improve the noise margins of the inner circuit where the gate of the source follower transistor of the first output stage is connected to the first output of the inner circuit, the gate of the source follower transistor of the second output stage is connected to the second output of the inner circuit, the gate of the pull-down transistor of the first output stage is connected to a logically equivalent point to the source of the source follower of the second output buffer stage and the gate of the pull-down transistor of the second output stage is connected to a logically equivalent point to the source of the first source follower of the output buffer stage.

7. A GaAs differential current switch circuit as recited in claim 6 where the first and second output buffer stages further comprise:
 a second source follower transistor and a second pull-down transistor in each output buffer stage to minimize the effect of external wiring capacitance on the inner circuit where the gates of the first and second source follower transistors of each output buffer stage are connected, the gates of the first and second pull-down transistors of each output buffer stage are connected, the source of the second source follower transistor of the first output buffer is connected to the first output of the GaAs differential current switch circuit, and the source of the second source follower transistor of the second output buffer is connected to the second output of the GaAs differential current switch circuit.

8. A GaAs differential current switch circuit as recited in claim 6 where the gate of the pull-down transistor in the first output buffer stage is connected to the first differential input and the gate of the pull-down transistor of the second output buffer stage is connected to the second differential input.

9. A GaAs differential current switch circuit as recited in claim 6 where the first and second output buffer stages further comprise:
 a second pull-down transistor in each output buffer stage where the gate of the second pull-down transistor in the first output buffer stage is connected to the first differential input and the gate of the second pull-down transistor of the second output buffer stage is connected to the second differential input, and
 where the gate of the first pull-down transistor in the first output buffer stage is physically cross-coupled to the source of the source follower transistor of the second output buffer stage and the gate of the first pull-down transistor in the second output buffer stage is physically cross-coupled to the source of the source follower transistor of the first output buffer stage.

10. A GaAs differential current switch circuit as recited in claim 6 where the inner circuit is a latch.

11. A GaAs differential current switch circuit as recited in claim 6 where the inner circuit is a multiplexer.

12. A GaAs differential current switch circuit as recited in claim 6 where all current switch levels are driven from a single voltage level.

* * * * *